United States Patent [19]
Malhi

[11] Patent Number: 5,240,865
[45] Date of Patent: Aug. 31, 1993

[54] METHOD OF FORMING A THYRISTOR ON AN SOI SUBSTRATE

[75] Inventor: Satwinder Malhi, Garland, Tex.

[73] Assignee: Texas Instruments Incorporated, Dallas, Tex.

[21] Appl. No.: 910,954

[22] Filed: Jul. 9, 1992

Related U.S. Application Data

[60] Division of Ser. No. 722,376, Jun. 25, 1991, Pat. No. 5,172,208, which is a continuation of Ser. No. 559,485, Jul. 30, 1990, abandoned.

[51] Int. Cl.$^5$ .............................. H01L 49/00
[52] U.S. Cl. ............................ 437/6; 437/21; 437/32; 437/64
[58] Field of Search .............. 437/6, 21, 31, 32, 33, 437/39, 62, 63, 64

[56] References Cited

U.S. PATENT DOCUMENTS

| | | | |
|---|---|---|---|
| 4,631,561 | 12/1986 | Foroni et al. | 257/111 |
| 4,631,567 | 12/1986 | Kokado et al. | 257/162 |
| 4,636,830 | 1/1987 | Bhagat | 257/135 |
| 4,654,543 | 3/1987 | Atsumi | 257/162 |
| 4,662,957 | 5/1987 | Hagino | 437/6 |
| 4,794,441 | 12/1988 | Sugawara et al. | 257/162 |
| 4,843,448 | 6/1989 | Garcia et al. | 257/477 |
| 4,861,731 | 8/1989 | Bhagat | 437/62 |
| 4,929,563 | 5/1990 | Tsunoda e al. | 437/6 |
| 4,969,023 | 11/1990 | Svedberg | 257/404 |
| 4,987,087 | 1/1991 | Voss | 437/6 |
| 4,990,978 | 2/1991 | Kondoh | 257/378 |
| 5,051,808 | 9/1991 | Saito et al. | 257/370 |
| 5,075,737 | 12/1991 | Shinohara | 257/558 |
| 5,077,224 | 12/1991 | Schwarzbauer et al. | 437/6 |

OTHER PUBLICATIONS

B. J. Baliga et al., "The MOS Depletion-Mode Thyristor: A New MOS-Controlled Bipolar Power Device", *IEEE Electron Device Letters*, vol. 9, No. 8, Aug. 1988, pp. 411–413.

*Primary Examiner*—Brian E. Hearn
*Assistant Examiner*—C. Chaudhari
*Attorney, Agent, or Firm*—Ira S. Matsil; James C. Kesterson; Richard L. Donaldson

[57] ABSTRACT

A thyristor (38) is formed over an insulating layer (44). A gate (70) is operable to create a depletion region through the semiconductor layer (46) in which the thyristor (38) is implemented in order to turn the thyristor off. Isolation regions (48, 52) prevent operation of the thyristor from affecting adjacent devices.

20 Claims, 2 Drawing Sheets

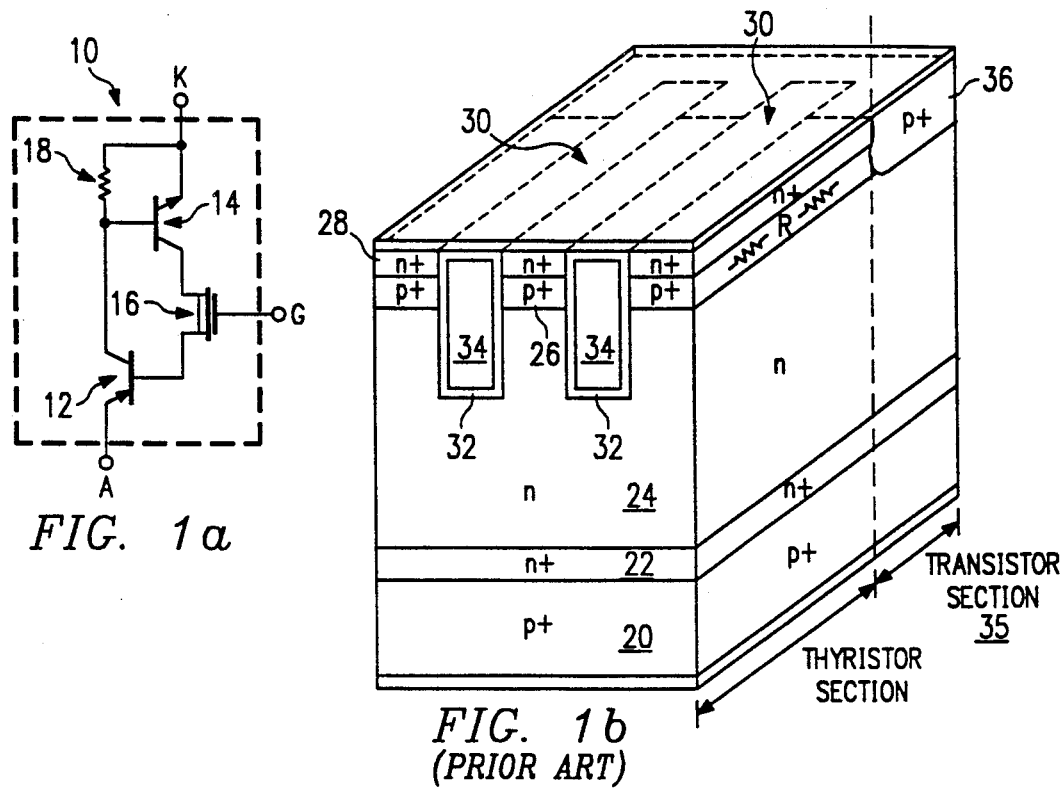
FIG. 1a
FIG. 1b
(PRIOR ART)
FIG. 2a
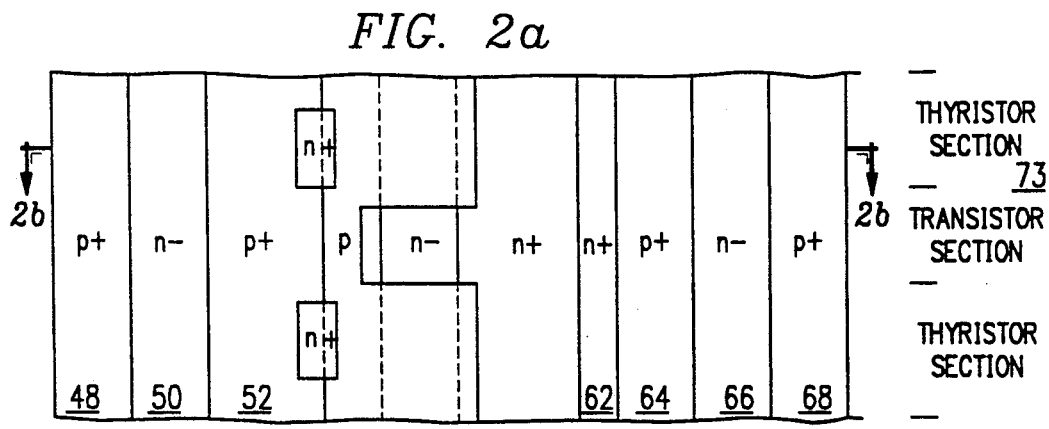
FIG. 2b

METHOD OF FORMING A THYRISTOR ON AN SOI SUBSTRATE

This is a division of application Ser. No. 07/722,376, now U.S. Pat. No. 5,172,208 filed Jun. 25, 1991 which is ia continuation of Ser. No. 07/559,485, now abandoned, filed Jul. 30, 1990.

TECHNICAL FIELD OF THE DISCLOSURE

This invention relates in general to integrated circuits, and more particularly to a thyristor and method of forming the same.

BACKGROUND OF THE DISCLOSURE

MOS-controlled power devices have become increasingly important in the design of integrated circuits. In the prior art, a MOSFET gate has been used to turn off a thyristor by short circuiting the emitter-base junction of the NPN transistor. This thyristor structure, however, exhibits poor current turn-off capability. A relatively new development is the depletion-mode thyristor (DMT) in which trenches are etched in a vertical thyristor device and filled with a conducting material to form gates. By applying voltage to the gates, a depletion region may be induced in the vertical thyristor which will turn off the device.

While the DMT has some advantages over prior art thyristor circuits, it also has several disadvantages. First, since the device is built on bulk silicon, trench etching must be used to form the gates which control the depletion region. The etching and refill processing is fairly complicated, thereby reducing yield and reliability of the devices. A further disadvantage is that a common P+ substrate used as the emitter of the PNP transistor makes it impossible to put several of the thyristors on a chip, since the P+ substrate/PNP emitter will be common to all the thyristors.

Therefore, a need has arisen in the industry to provide a thyristor which does not require trench processing and which can be fabricated such that other devices on the chip are not affected by its operation.

SUMMARY OF THE DISCLOSURE

In accordance with the present invention, a thyristor and method of forming the same is provided which substantially eliminates problems associated with prior such devices.

The thyristor of the present invention comprises a first lateral transistor having a collector coupled to the base of a second lateral transistor and a base coupled to the collector of the second lateral transistor. Decoupling circuitry is provided to prevent current flow through the base of first transistor responsive to a predetermined voltage.

The present invention provides several technical advantages over the prior art. First, the thyristor may be easily isolated from adjacent devices, such that its operation does not affect the devices. Further, the present invention may be formed without using trench and refill processes.

BRIEF DESCRIPTION OF THE DRAWINGS

For a more complete understanding of the present invention, and the advantages thereof, reference is now made to the following descriptions taken in conjunction with the accompanying drawings, in which:

FIG. 1a illustrates a schematic view of a depletion-mode thyristor;

FIG. 1b illustrates a three-dimensional perspective view of a prior art depletion-mode thyristor;

FIGS. 2a-b illustrate top and side cross-sectional views of the thyristor of the present invention.

DETAILED DESCRIPTION OF THE DISCLOSURE

Figure 3A:
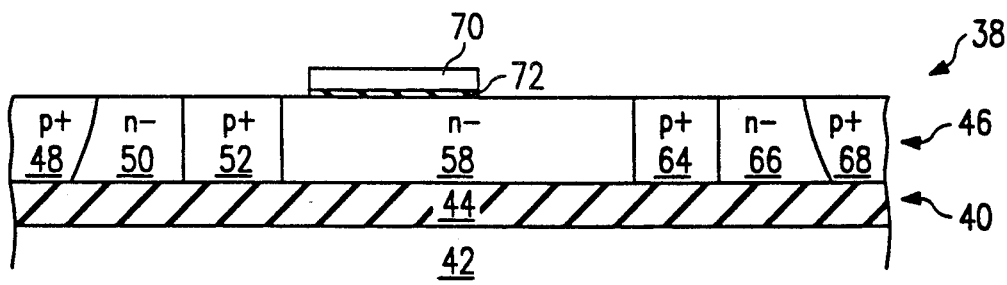
FIGS. 3a-d illustrate the processing stages involved in fabricating the thyristor of the present invention.

The preferred embodiment of the present invention is best understood by referring to FIGS. 1-3 of the drawings, like numerals being used for like and corresponding parts of the various drawings.

FIG. 1a illustrates a schematic of a depletion-mode thyristor. A thyristor is a switching device that does not require control current once it is switched on. Only a initial pulse of control current is needed to turn the thyristor on; after the pulse current stops, the thyristor continues to conduct current. Naturally, in some applications, it is desirable to have the ability to turn the thyristor off.

The thyristor 10, illustrated in FIG. 1a, has three inputs: an anode (A), a cathode (K) and a gate (G). A PNP transistor 12 has an emitter connected to the anode, a collector connected to the base of an NPN transistor 14 and a base connected to a source/drain of a depletion-mode MOS transistor 16. The emitter of the NPN transistor 14 is connected to the cathode and to its base through a resistor 18. The collector of the NPN transistor 14 is connected to the other source/drain of the depletion-mode MOS transistor 16. The gate of the MOS transistor 16 comprises the gate of the thyristor 10.

A positive voltage pulse applied to the gate G will enable the device to conduct current. An application of a negative voltage to the gate G switches the MOS transistor 16 off, thereby disabling current flow through the base of the PNP transistor. The MOS transistor 16 could be designed such that to turn off the thyristor device, the depletion layer would be formed in response to a zero voltage or a small positive voltage on the gate.

A cross-sectional perspective view of an implementation of the circuit of FIG. 1a is illustrated in FIG. 1b. The NPN and PNP transistors are provided by P+ layer 20, N+ layer 22, N layer 24, P layer 26 and N+ layer 28. Gates 30 are formed by etching trenches through layers 24-28, lining the trenches with an insulating material 32 and filling the trenches with a conductive material 34. A transistor section 35 is implemented by forming a P+ layer through a portion of layers 26 and 28.

In operation, the application of the negative voltage to the gates 30 creates a depletion layer between the gates 30 in the N layer 24. Hence, current is prevented from flowing from N+ layer 28 to P+ layer 20 because of the depletion region. The transistor section 35 allows stored charge to flow from the N layer 24. The current will flow only until the stored charge is removed by recombination.

While the implementation of FIG. 1b has many advantages, it also has several disadvantages. First, were two such thyristors formed on a single chip, they would share the P+ base layer 20. Hence, the circuits would behave as if their anodes were tied together. Further, since the gates 30, which create the depletion region, are formed using trench etching and refill, the fabrication of these thyristors is relatively difficult.

FIGS. 2a-b illustrate a depletion-mode thyristor formed on an SOI (silicon-on-insulator) substrate. FIG. 2a illustrates a top view of the device while FIG. 2b illustrates a cross-sectional side view of the device.

In the preferred embodiment, the thyristor 38 is formed on a SOI substrate, generally indicated by reference numeral 40. The SOI substrate 40 comprises a base layer 42, an insulator layer 44 and a silicon-on-insulator (SOI) layer 46. In this illustration, it will be assumed that the SOI layer 46 comprises an N— layer. Various doped regions are formed in the N— SOI layer 46, rendering P+ region 48, N— region 50, P+ region 52, N+ region 54, P region 56, N— region 58, N+ region 60, N+ region 62, P+ region 64, N— region 66, and P+ region 68. A gate 70 is formed over the SOI layer 46 and separated therefrom by gate oxide 72.

The operational portion of the thyristor 38 is comprised by layers 54-64 and gate 70. N+ region 54 is connected to the cathode terminal of the device and P+ region 64 is connected to the anode terminal of the device. The NPN transistor of the thyristor 38 comprises layers 54, 56 and 58 while the PNP portion of the device comprises regions 56, 58, 62 and 64. P+ regions 48 and 52 are used to isolate the thyristor 38 from adjacent devices.

In operation, current flow through the thyristor 38 is initiated by a positive voltage pulse on the gate 70. Once the thyristor 38 is turned on, it may be turned off by generating a negative voltage on the gate 70, thereby creating a depletion region through SOI N— region 58 which extends down to the insulator layer 44. The depletion region produces a potential barrier preventing current flow from N+ region 54 to N+ region 62. Alternatively, the thyristor may be turned off by a zero or slightly positive voltage by proper choice of gate material for adjusting the flatband voltage. The thyristor 38 can be turned on again by a positive voltage pulse on gate 70.

The transistor section 73 carries excess carriers out of the thyristor section. The transistor section basically forms a PNP transistor. Current flows through the PNP transistor so long as the stored charge in the thyristor section can drive the base of the PNP transistor. The shallow N+ region 60 prevents breakdown voltage between P+ region 64 and P region 56.

The present invention provides advantages over prior art devices. Since the gate 70 is formed over the SOI layer 46, no trench etching or refill is necessary. Further, the thyristor 38 can be completely isolated from adjacent devices or more than one such thyristor can be integrated on a single chip.

FIGS. 3a-d illustrate processing stages for fabricating the preferred embodiment of the present invention. In FIG. 3a, P+ regions 48, 52, 64 and 68 are implanted and diffused into the N— semiconductor layer 46 of the SOI substrate 40. Typically, boron is used as the dopant to form the P+ regions. A gate oxide is grown over the surface of the semiconductor layer 46 and a doped polysilicon layer is formed thereover. The polysilicon layer and gate oxide are etched to form gate 70 and gate oxide 72.

Figure 3B:
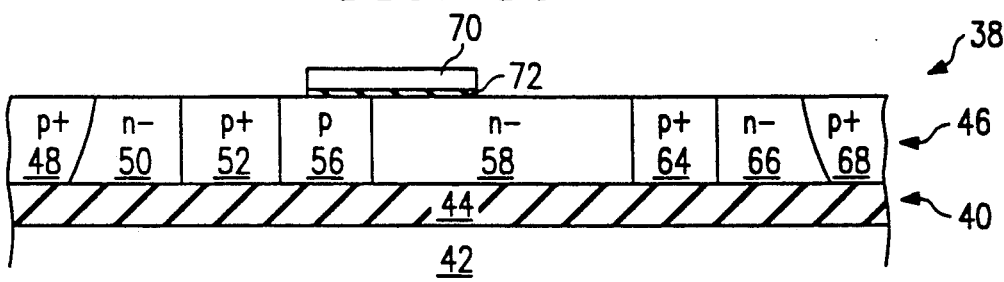

In FIG. 3b, boron is applied adjacent the gate 70 and is laterally diffused beneath the gate by a high temperature diffusion. The temperature and time of the diffusion will depend upon the desired lateral spread of the P region 56.

Figure 3C:
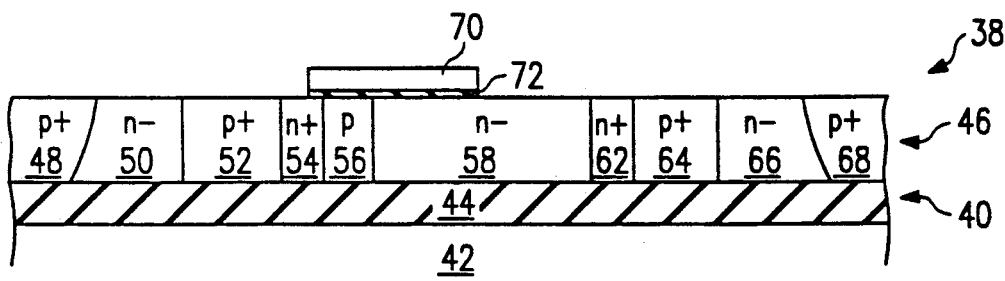

In FIG. 3c, N+ regions 54 and 62 are formed using deep implantation techniques which form N+ regions through the semiconductor layer 46 to the insulator layer 44. Typically, phosphorous is used as the N type dopant.

Figure 3D:
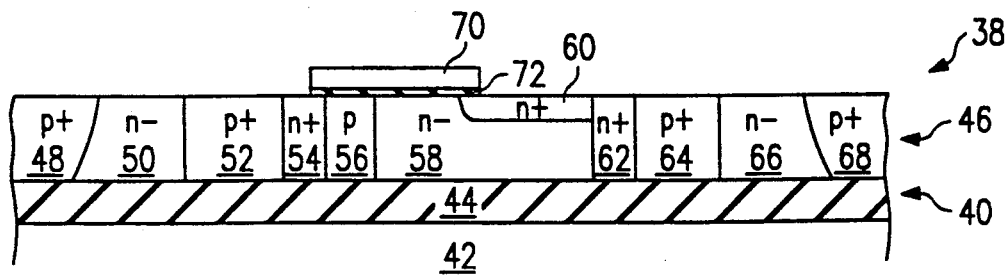

In FIG. 3d, the surface of the semiconductor layer 46 is masked and the shallow N+ region 60 is formed using normal implantation on doping techniques.

While the present invention has been illustrated showing a silicon controlled rectifier, it should be understood that the concepts described herein could also be used with other types of thyristors, such as triacs.

Although the present invention has been described in detail, it should be understood that various changes, substitutions and alterations can be made herein without departing from the spirit and scope of the invention as defined by the appended claims.

What is claimed is:

1. A method of forming a thyristor, comprising the steps of:

forming a semiconductor layer on an insulating layer;

forming a first n type region through the semiconductor layer and abutting said insulating layer;

forming a first p type region through said semiconductor layer and abutting said insulating layer, said first p type region adjacent said first n type region;

forming a second n type region disposed through said semiconductor layer and abutting said insulating layer, said second n type region adjacent said first p type region;

forming a second p type region disposed through said semiconductor layer and abutting said insulating layer, said second p type region adjacent said second n type region;

forming a third n type region disposed through said semiconductor layer and abutting said insulating layer, said third n type region adjacent said second p type region;

forming a third p type region disposed through said semiconductor layer and abutting said insulating layer, said third p type region adjacent said third n type region; and forming a gate overlying portions of said second and third n type regions and said second p type region.

2. The method of claim 1 wherein said step of forming a second n type region comprises the step of forming an n+ region.

3. The method of claim 1 wherein said step of forming a third n type region comprises the step of forming an n— region adjacent an n+ region, said n— region and said n+ region each abutting said insulating layer.

4. The method of claim 3 wherein said step of forming ga third n type region comprises the step of forming a shallow n+ region overlying said n— region.

5. The method of claim 1 and further comprising the step of forming isolation regions to isolate the thyristor from adjacent devices.

6. The method of claim 1 wherein said step of forming a first p type region comprises the step of forming a p+ region.

7. The method of claim 1 wherein said step of forming a third p type region comprises the step of forming a p+ region.

8. The method of claim 1 and further comprising the step of forming a fourth n type region through said semiconductor layer and abutting said insulating layer, said fourth n type region adjacent said third p type region.

9. The method of claim 8 and further comprising the step of forming a fourth p type region through said semiconductor layer and abutting said insulating layer, said fourth p type region adjacent said fourth n type region.

10. The method of claim 9 wherein said step of forming a fourth p type region comprises the step of forming a p+ region.

11. The method of claim 1 and further comprising the step of forming a fifth p type region through said semiconductor layer and abutting said insulating layer, said fifth p type region adjacent said first n type region.

12. The method of claim 11 wherein said step of forming a fifth p type region comprises the step of forming a p+ region.

13. A method of forming thyristor structure comprising the steps of:
   forming a first lateral transistor having base, emitter and collector regions directly on a surface of a first layer;
   forming a second lateral transistor having base, emitter and collector regions directly on said surface of said first layer, the collector of the first lateral transistor coupled to the base of the second lateral transistor and the base of the first lateral transistor coupled to the collector of the second lateral transistor; and
   providing decoupling circuitry including a gate electrode coupled between the base of the first transistor and the collector of the second lateral transistor, said decoupling circuitry capable to prevent current flow through the base of the first transistor responsive to a predetermined voltage of the gate electrode.

14. The method of claim 13 wherein said first lateral transistor comprises a lateral pnp transistor and said second lateral transistor comprises a lateral npn transistor.

15. The method of claim 14 wherein the collector of the pnp transistor and the base of the npn transistor comprise a common doped region.

16. The method of claim 14 wherein the base of the pnp transistor and the collector of the npn transistor comprise a common doped region.

17. The method of claim 13 wherein said step of providing decoupling circuitry comprises providing a depletion mode MOS transistor.

18. The method of claim 17 wherein the predetermined voltage comprises a voltage less than or equal to a small positive voltage.

19. The method of claim 13 wherein said step of providing decoupling circuitry comprises forming gate regions disposed adjacent said base of the first lateral transistor such that a depletion region is formed responsive to said predetermined voltage.

20. The method of claim 13 wherein said first and second lateral transistors are formed in a SOI substrate.

* * * * *